United States Patent
Busson et al.

(10) Patent No.: US 7,406,304 B2
(45) Date of Patent: Jul. 29, 2008

(54) ELECTRONIC COMPONENT WITH INTEGRATED TUNING DEVICE, ALLOWING THE DECODING OF DIGITAL TERRESTRIAL OR CABLE TELEVISION SIGNALS

(75) Inventors: Pierre Busson, Grenoble (FR);
Pierre-Oliver Jouffre, Grenoble (FR);
Bruno Paille, Saint Aupre (FR)

(73) Assignee: STMicroelectronics S.A., Montrouge (FR)

( * ) Notice: Subject to any disclaimer, the term of this patent is extended or adjusted under 35 U.S.C. 154(b) by 428 days.

(21) Appl. No.: 10/819,367

(22) Filed: Apr. 6, 2004

(65) Prior Publication Data

US 2004/0259512 A1 Dec. 23, 2004

(30) Foreign Application Priority Data

Apr. 11, 2003 (FR) .................................. 03 04554

(51) Int. Cl.
*H04B 1/10* (2006.01)
(52) U.S. Cl. ............... 455/307; 455/339; 455/226.1; 375/344
(58) Field of Classification Search ............ 455/161.1, 455/161.2, 164.1, 164.2, 179.1, 182.1, 182.2, 455/339, 334, 67.14, 286, 188.1, 226.1, 307, 455/296; 375/344
See application file for complete search history.

(56) References Cited

U.S. PATENT DOCUMENTS

| | | | | |
|---|---|---|---|---|
| 4,162,452 A | * | 7/1979 | Ash | 455/179.1 |
| 4,392,249 A | * | 7/1983 | Matsuura et al. | 455/164.1 |
| 4,885,801 A | * | 12/1989 | Hansen | 455/264 |
| 4,894,657 A | | 1/1990 | Hwang et al. | |
| 5,109,544 A | * | 4/1992 | Mittel et al. | 455/182.2 |
| 5,220,164 A | | 6/1993 | Lieber et al. | |
| 5,307,515 A | * | 4/1994 | Kuo et al. | 455/295 |
| 5,329,319 A | * | 7/1994 | Sgrignoli | 348/733 |
| 5,450,621 A | * | 9/1995 | Kianush et al. | 455/192.2 |
| 5,487,186 A | * | 1/1996 | Scarpa | 455/192.2 |
| 5,737,035 A | * | 4/1998 | Rotzoll | 348/725 |
| 5,752,179 A | * | 5/1998 | Dobrovolny | 455/266 |
| 5,774,799 A | * | 6/1998 | Croft et al. | 455/192.2 |
| 5,825,833 A | * | 10/1998 | Sakaue | 375/344 |

(Continued)

FOREIGN PATENT DOCUMENTS

EP   0 481 543 A1   4/1992

(Continued)

OTHER PUBLICATIONS

Nguyen, C. T.-C., Micromechanical Resonators for Oscillators and Filters, 1995 IEEE Ultrasonics Symposium, Proceedings, Nov. 7, 1995, pp. 489-499, XP01057252.

(Continued)

*Primary Examiner*—Blane J Jackson
(74) *Attorney, Agent, or Firm*—Gardere Wynne Sewell LLP

(57) ABSTRACT

An integrated superheterodyne dual-conversion tuner upconverts a signal so as to place it outside a reception band, and then downconverts the signal with a non-zero intermediate frequency. A first filter of the bulk acoustic wave type is positioned between the up and down conversion and is calibrated in such a way as to accurately determine its central frequency. A second filter of a microelectromechanical type receives the downconverted signal and is calibrated in such a way as to accurately determine its central frequency.

19 Claims, 4 Drawing Sheets

U.S. PATENT DOCUMENTS

| | | | |
|---|---|---|---|
| 5,857,004 A | 1/1999 | Abe | |
| 5,953,636 A | 9/1999 | Keate | |
| 6,031,878 A | 2/2000 | Tomasz et al. | |
| 6,101,369 A * | 8/2000 | Takahashi | 455/182.2 |
| 6,147,713 A | 11/2000 | Robbins et al. | |
| 6,275,990 B1 | 8/2001 | Dapper et al. | |
| 6,400,416 B1 | 6/2002 | Tomasz | |
| 6,424,074 B2 * | 7/2002 | Nguyen | 310/309 |
| 6,535,766 B1 * | 3/2003 | Thompson et al. | 607/60 |
| 6,549,766 B2 * | 4/2003 | Vorenkamp et al. | 455/307 |
| 6,714,776 B1 * | 3/2004 | Birleson | 455/302 |
| 6,813,484 B1 * | 11/2004 | Tolson | 455/307 |
| 6,885,853 B2 * | 4/2005 | Sevens et al. | 455/255 |
| 6,952,594 B2 * | 10/2005 | Hendin | 455/552.1 |
| 6,983,136 B2 * | 1/2006 | Mason et al. | 455/307 |
| 7,039,385 B1 * | 5/2006 | Hoffmann et al. | 455/340 |
| 7,054,606 B1 * | 5/2006 | Sheng et al. | 455/306 |
| 7,098,757 B2 * | 8/2006 | Avazi et al. | 333/186 |
| 7,177,615 B2 * | 2/2007 | Ono | 455/296 |
| 2003/0053562 A1 | 3/2003 | Busson et al. | |
| 2005/0162040 A1 | 7/2005 | Robert | |
| 2006/0166639 A1 * | 7/2006 | Kaiser et al. | 455/339 |

FOREIGN PATENT DOCUMENTS

FR     2 824 986 A1     11/2002

OTHER PUBLICATIONS

French Search Report, FR 03 04554, dated Oct. 2, 3003.
Poulton, et al., "a 4GSample/s 8b ADC in 0.35um CMOS", ISSCC 2002, pp. 166-457, XP010585513.

* cited by examiner

ELECTRONIC COMPONENT WITH INTEGRATED TUNING DEVICE, ALLOWING THE DECODING OF DIGITAL TERRESTRIAL OR CABLE TELEVISION SIGNALS

PRIORITY CLAIM

The present application claims priority from French Application for Patent No. 03 04554 filed Apr. 11, 2003, the disclosure of which is hereby incorporated by reference.

BACKGROUND OF THE INVENTION

1. Technical Field of the Invention

The present invention relates to the decoding of radiofrequency transmission channels conveying coded digital information.

The invention thus applies advantageously to digital terrestrial television, that is to say using signals transmitted between television antennas, as defined, for example, in the European DVB-T (Digital Video Broadcasting-terrestrial) or in the North-American ATSC (Advisory Committee on Advanced Television Service Digital TV) specification, or to digital cable television, as defined, for example, in the European DVB-C (Digital Video Broadcasting-cable) or in the North-American ITU-J83 Annex A/B/C/D (International Telecommunication Union) specification, all these telebroadcasts being based on the MPEG transmission standards, and use for example to convey information, quadrature digital modulation, or else modulation of the COFDM type according to terminology well known to the person skilled in the art.

The invention also relates in particular to tuners.

2. Description of Related Art

The television signals received at the input of a tuner of a receiver are composed of the entire set of channels transmitted that lie in the 45 MHz-860 MHz frequency band. The objective of the tuner is to select the desired channel and to output a baseband signal on the in-phase path (I path) and on the quadrature path (Q path). This signal is thereafter converted into a digital signal and demodulated. The channel decoding processing thereafter also comprises a block which distinguishes, typically by means of majority logic, zeros from ones, then performs all the error correction, that is to say typically a Viterbi decoding, the interleaving, Reed-Solomon decoding and deshuffling. The channel decoding device outputs packets that are decoded in a conventional manner in a source decoding device in accordance with the MPEG standards so as to reoutput the initial audio and video signals transmitted via antennas or via the cable.

Current studies are aimed at researching ever more integrated solutions for the embodiment of digital terrestrial or cable television receivers. However, this research hits technological difficulties related to the embodiment of the means making it possible, on the one hand, to correctly discern a channel from the entire set of channels present, and, on the other hand, to correctly discriminate the signal from noise. Specifically, whereas in digital satellite television, all the channels have nearly the same power, this is not the case in particular in digital terrestrial television. Thus, it is for example possible to have adjacent channels exhibiting a very high power with respect to the desired channel, for example a difference in power of the order of 40 dB. It is therefore necessary to be able to ensure rejection of 40 dB on the adjacent channels. Moreover, the specification imposes a signal/noise ratio of the order of 30 dB. Hence, in the worst case, it is therefore essential for it to be possible to bring the level of an adjacent channel to 70 dB below its input level. This results in extremely significant constraints on the filters, this being extremely constraining in respect of integrated solutions.

There exists a need to solve this problem. More specifically, there is a need for a totally integrated solution for the tuner, given the characteristics of digital television signals, in particular terrestrial ones, exhibiting more significant rejection constraints than digital cable television signals.

SUMMARY OF THE INVENTION

An embodiment of the present invention proposes an electronic component comprising an integrated circuit embodied on a monolithic substrate and comprising a tuning module of the superheterodyne type with non zero intermediate frequency dual upconversion then downconversion, possessing an input able to receive digital terrestrial or cable television analog signals composed of several channels, a bandpass filter of the bulk acoustic wave type disposed between the two frequency transposition stages and delivering a filtered analog signal containing the information conveyed by a desired channel and so-called adjacent channels information, a bandpass filter of the microelectromechanical type disposed downstream of the second frequency transposition stage and able to eliminate the adjacent channels information, first means for determining the central frequency of the bulk acoustic wave filter, and second means for determining the central frequency of the microelectromechanical filter, Stated otherwise, the invention solves in particular the problem of the filtering of the adjacent channels using in combination, an integrated filter of the bulk acoustic wave type ("BAW" filter), and an integrated filter of the microelectromechanical type generally formed of at least one micromechanical resonator (MMR). Thus, the bulk acoustic wave filter performs a prefiltering of the signal so as to allow through only the desired channel and a few adjacent channels. Then the adjacent channels information is eliminated by the filter MMR.

Moreover, it is known that the central frequency of a bulk acoustic wave filter, which in practice consists for example of at least two resonators of the bulk acoustic wave type, is difficult to control accurately on the basis of the physical characteristics of the resonators.

The same holds as regards the central frequency of the filter MMR.

This problem which a priori renders the use of an integrated filter of the BAW type and of an integrated filter of the MMR type incompatible in a tuner, is solved according to the invention by an in-situ explicit determination of the central frequency of the filter.

The channels of television signals extend over a predetermined frequency span, typically 45 MHz-860 MHz.

And according to one embodiment of the invention, the first means for determining the central frequency of the BAW filter comprise means which are able, in the absence of the signal at the input of the first transposition stage, to vary beyond the upper limit of the said frequency span, the frequency of a calibration transposition signal applied to this transposition stage, and detection means able to determine for each value of the frequency of the calibration signal, the power of the signal at the output of the bulk acoustic wave filter and to detect the maximum power, the central frequency of the BAW filter then being the frequency of the calibration signal corresponding to this maximum value of power.

Likewise according to one embodiment of the invention, the second means of determination comprise means able in the absence of any signal at the input of the second transposition stage, to vary in the neighborhood of a predetermined reference intermediate frequency, the frequency of a calibration transposition signal applied to this transposition stage, and means of detection able to determine for each value of the frequency of the calibration signal, the power of the signal at the output of the microelectromechanical filter and to detect the maximum power, the central frequency of the filter then being the frequency of the calibration signal corresponding to this maximum value of power.

This said, the invention is not limited to these particular methods of determining central frequency.

According to one embodiment of the invention, after the calibration phase, the first frequency transposition stage is able to receive a first transposition signal having a frequency equal for example to the sum of the frequency of the desired channel and of the said determined central frequency of the bulk acoustic wave filter. By way of indication, a possible value for this central frequency is 1220 MHz.

This said, it could also be possible for the frequency of the first transposition signal to be equal to the difference between the said central frequency and the frequency of the desired channel.

Choosing a transposition frequency of the first transposition signal greater than the upper limit of the frequency span, that is to say greater than 860 MHz, makes it possible to go with this upconversion, outside the reception band, and thus to avoid interactions with the first transposition frequency.

Moreover, after the determination of the central frequency of the microelectromechanical filter, the second frequency transposition stage is able to receive a second transposition signal having a frequency equal to the said central frequency of the bulk acoustic wave filter, minus the central frequency of the microelectromechanical filter.

The passband of the bulk acoustic wave filter is for example of the order of two to three times the frequency width of a channel. Thus, by way of indication, the frequency width of a channel being of the order of 8 MHz, it will be possible to choose a passband of the order of 20 MHz for the bulk acoustic wave filter.

The passband of the microelectromechanical filter is for its part for example of the order of the frequency width of a channel.

According to one embodiment of the invention, the component comprises a digital stage linked to the tuning module by an analog/digital conversion stage, and comprising channel decoding means.

This digital stage can incorporate the first and second means of frequency determination.

The first means of frequency determination and the second means of frequency determination are embodied for example within one and the same hardware architecture.

The subject of the invention is also a terrestrial or cable digital television signals receiver, comprising an electronic component as defined hereinabove.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
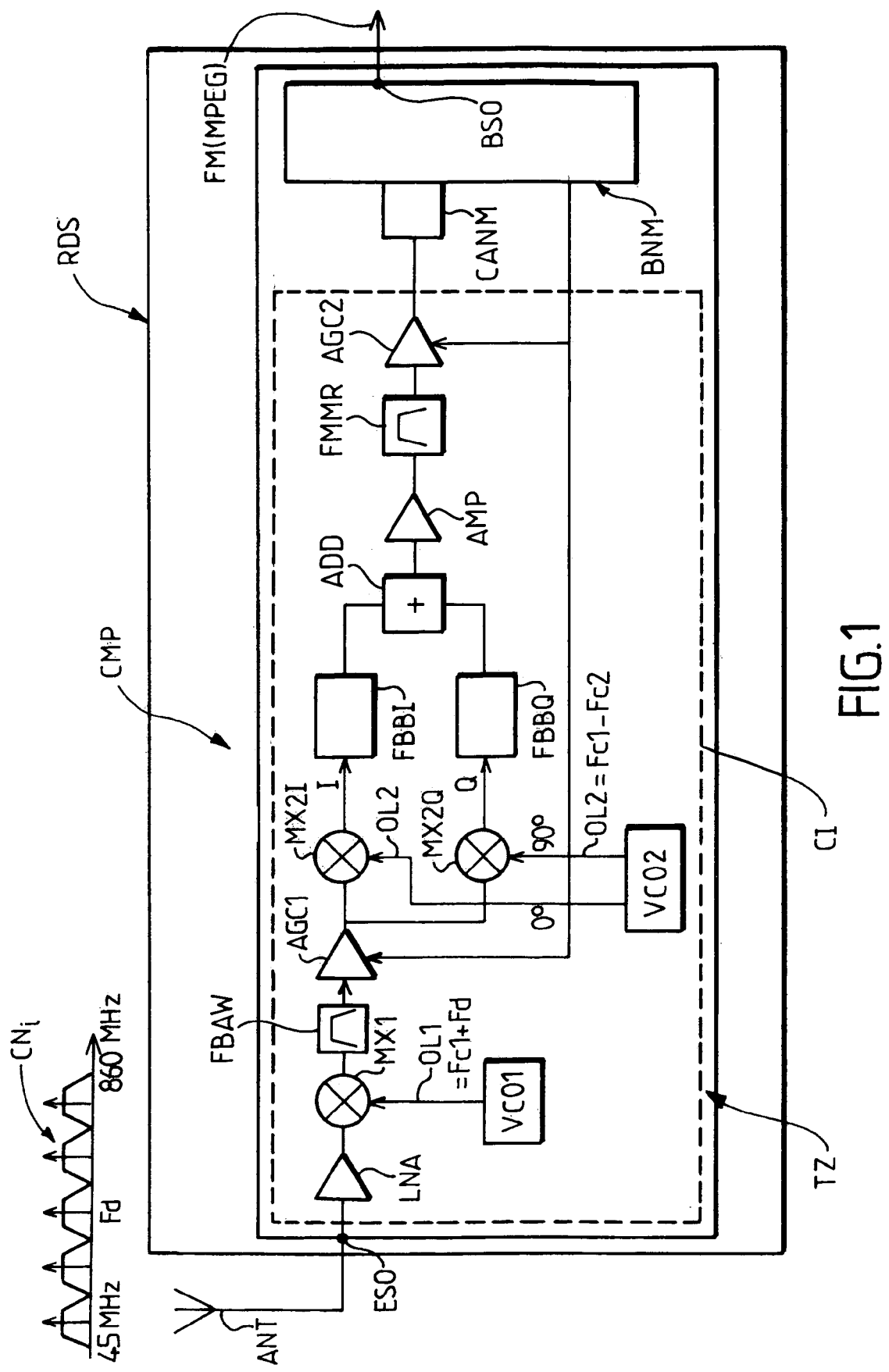
FIG. 1 is a schematic of the internal structure of an electronic component according to the invention.

In FIG. 1, the reference RDS denotes a receiver/decoder connected to an antenna ANT picking up digital terrestrial television signals, this receiver being intended to receive and to decode these signals.

The receiver RDS comprises at the head end an electronic component CMP intended to receive all the channels $CN_i$ present in the signal received at the signal input ESO of this component, and to deliver, at the output BSO, an MPEG data stream corresponding to a selected channel. The component CMP comprises an integrated circuit IC (chip) embodied entirely in CMOS technology on a monolithic silicon substrate. The component CMP comprises at the head end a tuning device or "tuner" TZ, intended for selecting a channel from among all the channels $CN_i$ present in the signal received at the signal input ESO which is also here the input of the tuner.

The tuner TZ is integrated entirely on the IC chip. This tuner TZ is here a dual-conversion tuner, firstly upconversion then downconversion with intermediate frequency, so as to ultimately bring the signal back to an intermediate frequency that lies in the neighborhood of a value predefined by the standard, for example 36 MHz. The tuner TZ comprises at the head end a low noise amplifier LNA connected to the signal input ESO. This amplifier LNA is followed by a first frequency transposition stage (mixer) MX1. This mixer MX1 receives, on the one hand, the signal emanating from the low noise amplifier LNA and, on the other hand, a transposition signal OL1 emanating for example from a voltage-controlled oscillator VCO1.

During normal operation, this transposition signal OL1 has a frequency preferably equal to the sum of the frequency Fd of the desired channel and of the central frequency Fc1 of an integrated bandpass filter of the bulk acoustic wave type FBAW disposed downstream of the mixer MX1.

Filters of the bulk acoustic wave type are known per se to the person skilled in the art. They are, for example, formed of at least two resonators of the bulk acoustic wave type, also sometimes referred to loosely as a piezoelectric resonator. Such resonators are, for example, described in the article by Sang Hee Kim et al. entitled "AIN-Based Film Bulk Acoustic Resonator Devices with W/SiO2 Multilayers Reflector for RF Band Pass Filter Application", J. Vac. Sci. Technol. B 19(4), July/August 2001, or else in the article by K. M. Lakin entitled "Thin Film Resonators and Filters", 1999 IEEE ULTRASONICS SYMPOSIUM, p. 895-906. Moreover, the latter article illustrates the embodying of filters of the BAW type, formed of several resonators disposed as a ladder.

The central frequency of the integrated filter FBAW is not defined accurately on the basis solely of the technological characteristics and dimensioning of the resonators. Only the bandwidth of the filter is well defined. Hence the invention provides for first means of determination able to determine this central frequency during a calibration phase.

Figure 2:
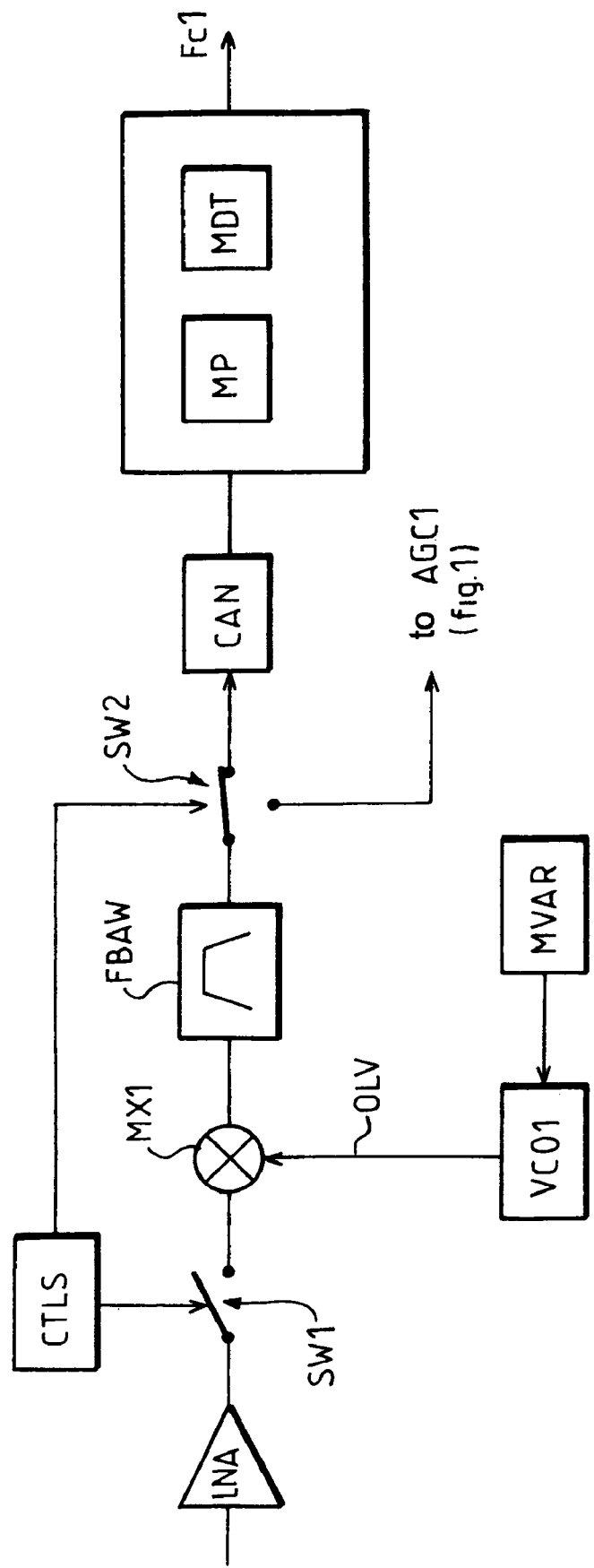
FIG. 2 more particularly relates to a phase of calibration according to the invention of the central frequency of a filter of the bulk acoustic wave type.

More precisely, according to an exemplary embodiment illustrated in FIG. 2, the first means of determination of this central frequency control means CTLS able to control a first breaker SW1 disposed between the output of the amplifier LNA and the input of the mixer MX1, and a second breaker SW2 connected downstream of the filter FBAW.

In the calibration phase the first breaker SW1 is open (FIG. 2), whereas in the phase of normal operation it is closed (FIG. 1). Stated otherwise, in the calibration phase there is an absence of signal at the input of the first transposition stage MX1, whereas the signal received by the antenna is present at the input of the first transposition stage MX1 in the phase of normal operation.

Control means MVAR are able to control the oscillator VCO1 in such a way as to make vary beyond the upper limit of the 45 MHz-860 MHz frequency span, the frequency of a calibration transposition signal OLV applied to this transposition stage MX1. Specifically, a filter FBAW has been chosen whose central frequency lies a priori beyond this frequency span. The signal at the output of the filter FBAW is directed by way of the switch SW2 to an analog digital converter CAN.

Post-processing means then comprise means MP able to determine for each value of the frequency of the calibration signal, the power of the signal at the output of the bulk acoustic wave filter, and means MDT able to detect the maximum power. The central frequency Fc1 of the filter FBAW is then the frequency of the calibration signal corresponding to this maximum value of power. By way of example, the means MP can calculate the power of the signal by calculating, for example, the modulus thereof. A simplified way of calculating the modulus of the signal is provided by the following formula:

Modulus $(S)$=Max (abs $(S)$)+½ Min (abs $(S)$)

In this formula, Max denotes the maximum value, Min denotes the minimum value and abs denotes the absolute value, S the signal delivered by the analog digital converter CAN.

Figure 4:
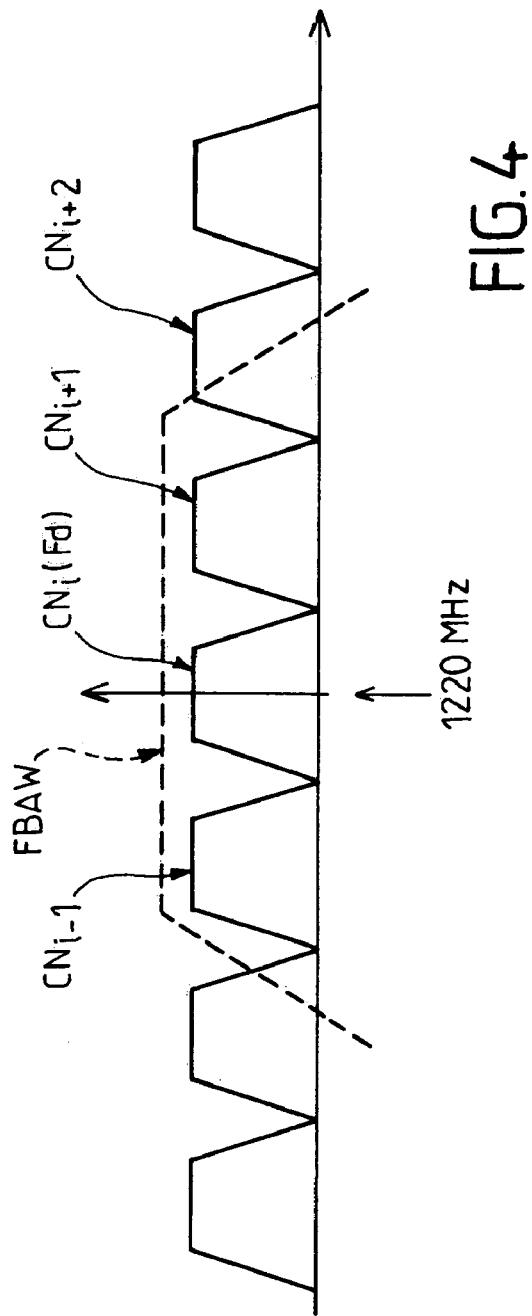
FIG. 4 diagrammatically illustrates a frequency chart of channels before and after filtering.

By way of example, it will be assumed in the subsequent text that the central frequency Fc1 of the filter FBAW is equal to 1220 MHz. After the calibration phase, that is to say during normal operation, the switch SW1 is closed (FIG. 1) and the first transposition signal OL1 then has, for example, a frequency equal to 1220 MHz+Fd, where Fd denotes the frequency of the desired channel $CN_i$. Consequently, the signal at the output of the mixer MX1 is, as illustrated in FIG. 4, a signal comprising all the channels, but whose desired channel $CN_i$ is centered around the central frequency of the filter FBAW, that is to say 1220 MHz.

This filter FBAW is relatively steep and consequently makes it possible to eliminate a large number of undesired adjacent channels, situated on either side of the desired channel $CN_i$. By way of indication, the filter FBAW can exhibit a passband of 20 MHz. Given the fact that the width of a channel is of the order of 8 MHz, the signal at the output of the filter FBAW will comprise the desired channel $CN_i$ and two or three immediately adjacent channels, as is illustrated diagrammatically also in FIG. 4.

At the output of the filter FBAW, the signal is during normal operation amplified in a controlled-gain amplifier AGC1 (FIG. 1; switch SW2 linking the filter FBAW and the amplifier AGC1). Then, this signal undergoes a second conversion, this time a downconversion, within a second frequency transposition stage here formed of two mixers MX2I and MX2Q, respectively receiving two frequency transposition signals OL2 mutually out of phase by 90°. These frequency transposition signals OL2 emanate for example also from a voltage-controlled oscillator VCO2. The frequency of the second transposition signal OL2 is equal to the central frequency Fc1 of the filter FBAW, that is to say here 1220 MHz, minus the central frequency Fc2 of a filter of the microelectromechanical type FMMR.

Before returning in greater detail to the determination of the central frequency of the filter FMMR, the conventional elements known per se disposed between the mixers MX2I, MX2Q and the filter FMMR will briefly be described. More precisely, after filtering in filters FBBI and FBBQ, the signals of the two processing paths I and Q are summed in an adder ADD so as to reduce the level of the image frequency. The resulting signal is then amplified in an amplifier AMP before being fed to the filter FMMR.

The filters of the microelectromechanical type are known per se to the person skilled in the art. They are for example formed of at least one resonator of the micromechanical type. Examples of resonators and micromechanical filters are for example described in the article by Clark T.-C. Nguyen entitled "Micromechanical Circuits for Communication Transceivers," Proceedings, 2000 Bipolar/BiCMOS Circuits and Technology Meeting (BCTM), Minneapolis, Minn., 25-26 Sep. 2000, pp 142-149, or in the article by Liwei Lin et al entitled "Microelectromechanical Filters for Signal Processing", Journal of Microelectromechanical Systems, vol. 7, No. 3, September 1998.

Figure 3:
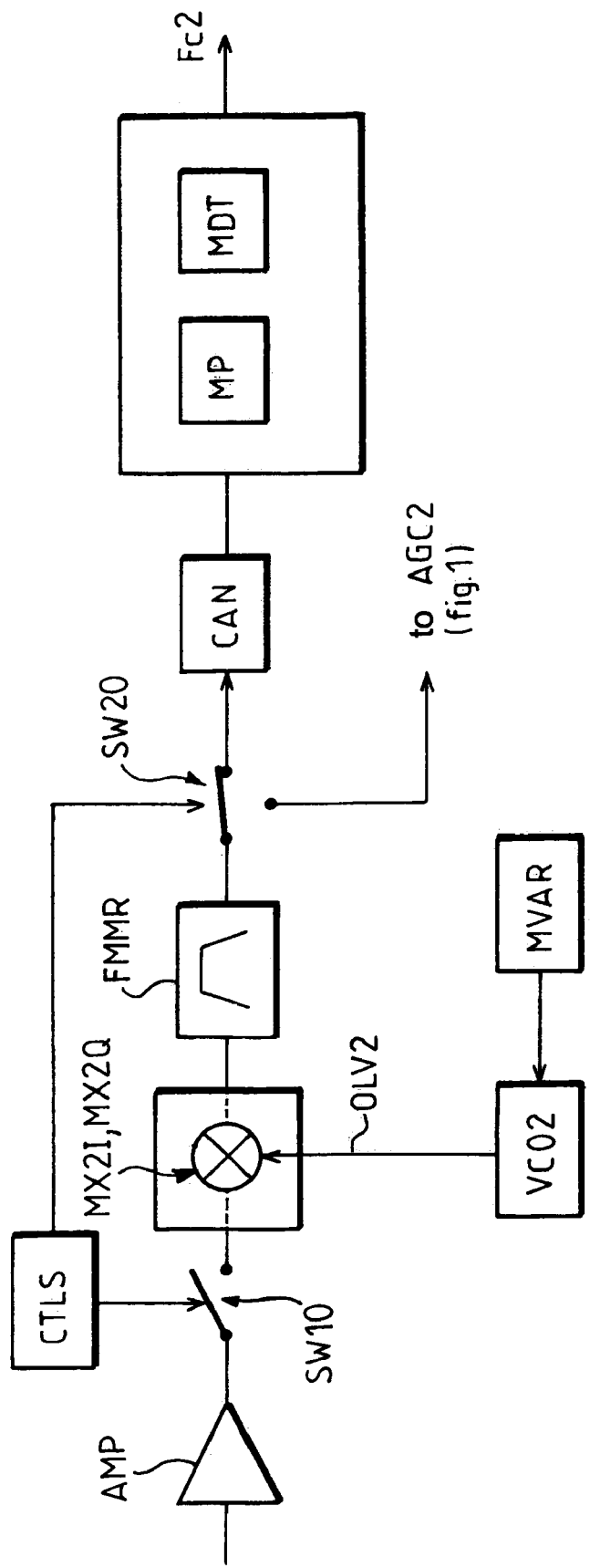
FIG. 3 more particularly relates to a phase of calibration according to the invention of the central frequency of a filter of the microelectromechanical type.

Just as the filters of the BAW type, the central frequency of the integrated filter FMMR is not defined accurately on the basis solely of the technological characteristics and dimensioning of the resonator or resonators. Only the bandwidth of the filter is well defined. Hence, the invention provides second means of determination able to determine this central frequency during the calibration phase. More precisely, according to an exemplary embodiment illustrated in FIG. 3, the second means of determination of this central frequency comprise control means CTLS able to control a first breaker SW10 disposed between the output of the amplifier AMP and the input of the mixing stage MX2, and a second breaker SW20 connected downstream of the filter FMMR.

In the calibration phase the first breaker SW10 is open (FIG. 3) whereas in the phase of normal operation it is closed (FIG. 1). Stated otherwise in the calibration phase there is an absence of any signal at the input of the second transposition stage MX2, whereas the signal is present at the input of this transposition stage MX1 in the phase of normal operation. In the example described here, a filter FMMR having a priori a central frequency of the order of 36 MHz will be chosen.

Control means MVAR are able to control the oscillator VCO2 in such a way as to make vary the frequency of a calibration transposition signal OLV2 applied to this transposition stage MX2, in a frequency span encompassing the value of 36 MHz. The signal at the output of the filter FMMR is directed by way of the switch SW20 through an analog digital converter CAN. Post-processing means, similar to those described for the calibration of the filter FBAW, then comprise means MP be able to determine for each value of the frequency of the calibration signal OLV2, the power of the signal at the output of the filter FMMR, and means MDT able to detect the maximum power.

Figure 5:
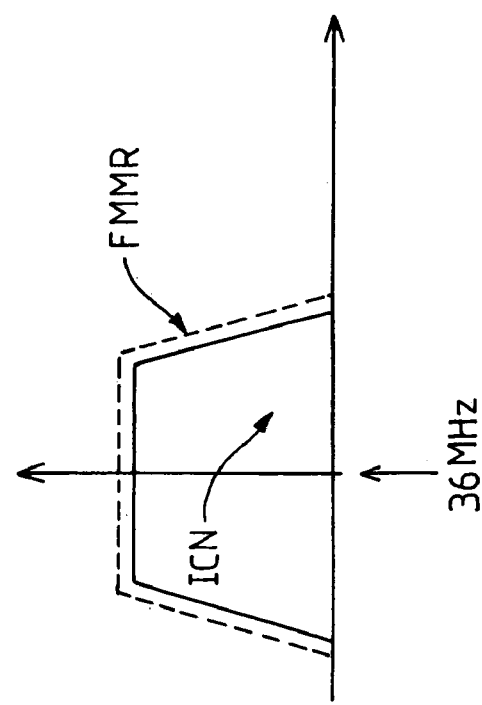
FIG. 5 diagrammatically illustrates a frequency chart of channels before and after filtering.

The central frequency Fc2 of the filter FMMR is then the frequency of the calibration signal corresponding to this maximum value of power. By way of example, it will be assumed in the subsequent text that the central frequency Fc2 of the filter FMMR is equal to 36 MHz. The second frequency transposition will bring the signal back to the frequency of 36 MHz, and since the passband of the filter FMMR is of the order of the frequency width of a channel, i.e., 8 MHz, the signal of the output of the filter MMR comprises the information ICN of the desired channel, centered around the frequency Fc2, i.e., 36 MHz in the present case (FIG. 5).

At the output of the filter FMMR, the signal is under normal operation, amplified in a controlled gain amplifier AGC2 (FIG. 1; switch SW20 linking the filter FMMR and the amplifier AGC2). The signal is then sampled in an analog/digital conversion stage CANM, for example at a sampling frequency of 50 MHz.

The stage CANM is followed by a conventional digital block comprising in particular conventional means of channel decoding and delivering the stream FM of MPEG data corresponding to the desired channel. By way of example, the STV0297J component from the company STMicroelectronics SA may be used in this regard, in respect of cable transmission, and the STV0360 component from the company STMicroelectronics SA may be used in respect of RF transmission.

As in this example the intermediate frequency is greater than half the sampling frequency, the conventional technique of narrowband subsampling is used, that is to say after sampling, the low frequency copy of the IF (intermediate frequency) spectrum is used.

The first and second means of determining central frequency may advantageously be embodied on the same chip as that incorporating the STV0297J or STV0360 components, and use some of the elements of these components such as for example the analog/digital conversion stage or else the control means.

It is also appropriate to note that if the determined central frequency of the filter MMR is not exactly the intermediate frequency specified by the standard, the corresponding correction is performed in a conventional and known manner in the channel decoding means.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An electronic component, comprising:
an integrated circuit embodied on a monolithic substrate and comprising:
a superheterodyne type tuning module with non zero intermediate frequency dual upconversion then downconversion, possessing an input able to receive digital terrestrial or cable television analog signals composed of several channels,
a bulk acoustic wave type bandpass filter disposed between two frequency transposition stages of the tuning module and delivering a filtered analog signal containing the information conveyed by a desired channel and adjacent channels information, wherein the bulk acoustic wave type bandpass filter has a first passband having a bandwidth wider than a plurality of channels,
a microelectromechanical type bandpass filter disposed downstream of a second frequency transposition stage and able to eliminate the adjacent channels information, wherein the microelectromechanical type bandpass filter has a second passband having a bandwidth in excess of a single channel;
first means for determining a center frequency of the first passband for the bulk acoustic wave filter, and
second means for determining a center frequency of the second passband for the microelectromechanical filter.

2. The component according to claim 1, wherein the component comprises a digital stage linked to the tuning module by an analog/digital conversion stage, and comprising a channel decoder circuit.

3. The component according to claim 2, wherein the digital stage incorporates the first and second means for determining.

4. An electronic component comprising:
an integrated circuit embodied on a monolithic substrate and comprising:
a superheterodyne type tuning module with non zero intermediate frequency dual upconversion then downconversion, possessing an input able to receive digital terrestrial or cable television analog signals composed of several channels,
a bulk acoustic wave type bandpass filter disposed between two frequency transposition stages of the tuning module and delivering a filtered analog signal containing the information conveyed by a desired channel and adjacent channels information,
a microelectromechanical type bandpass filter disposed downstream of a second frequency transposition stage and able to eliminate the adjacent channels information;
first means for determining the central frequency of the bulk acoustic wave filter, and
second means for determining the central frequency of the microelectromechanical filter;
wherein the first means for determining comprise means in the absence of a signal at the input of a first transposition stage for varying beyond an upper limit of a frequency span of the channels the frequency of a calibration transposition signal applied to the first transposition stage, and detection means for determining for each value of the frequency of the calibration signal the power of the signal at the output of the bulk acoustic wave filter and to detect the maximum power, the central frequency of the bulk acoustic wave filter then being the frequency of the calibration signal corresponding to this maximum value of power.

5. The component according to claim 4, wherein the second means for determining comprises means able in the absence of any signal at the input of the second transposition stage for varying in the neighborhood of a predetermined reference intermediate frequency the frequency of a calibration transposition signal applied to the second transposition stage, and means for detecting that determines for each value of the frequency of the calibration signal the power of the signal at the output of the microelectromechanical filter and to detect the maximum power, the central frequency of the microelectromechanical filter then being the frequency of the calibration signal corresponding to this maximum value of power.

6. The component according to claim 5, wherein after the determination of the central frequency of the bulk acoustic wave filter the first frequency transposition stage is configured to receive a first transposition signal having a frequency equal either to the sum of the frequency of the desired channel and of the said central frequency of the bulk acoustic wave filter greater than the upper limit of the frequency span, or to the difference between the central frequency and the frequency of the desired channel, in that after the determination of the central frequency of the microelectromechanical filter the second frequency transposition stage is able to receive a second transposition signal having a frequency equal to the said central frequency of the bulk acoustic wave filter minus the central frequency of the microelectromechanical filter, and wherein the passband of the bulk acoustic wave filter is of the order of two to three times the frequency width of a channel, and wherein the passband of the microelectromechanical filter is of the order of the frequency width of a channel.

7. The component according to claim 6, wherein the passband of the bulk acoustic wave filter is of the order of 20 MHz, and in that the passband of the microelectromechanical filter is of the order of 8 MHz.

8. The component according to claim 1, wherein the first means for determining and the second means for determining are embodied within one and the same hardware architecture.

9. The component of claim 1, wherein the component is a part within a digital terrestrial or cable television signal receiver.

10. An electronic component comprising:
an integrated circuit embodied on a monolithic substrate and comprising:
a superheterodyne type tuning module with non zero intermediate frequency dual upconversion then downconversion, possessing an input able to receive digital terrestrial or cable television analog signals composed of several channels,
a bulk acoustic wave type bandpass filter disposed between two frequency transposition stages of the tuning module and delivering a filtered analog signal containing the information conveyed by a desired channel and adjacent channels information,
a microelectromechanical type bandpass filter disposed downstream of a second frequency transposition stage and able to eliminate the adjacent channels information;
first means for determining the central frequency of the bulk acoustic wave filter, and
second means for determining the central frequency of the microelectromechanical filter;
wherein the second means for determining comprises means able in the absence of any signal at the input of the second transposition stage for varying in the neighborhood of a predetermined reference intermediate frequency the frequency of a calibration transposition signal applied to the second transposition stage, and means for detecting that determines for each value of the frequency of the calibration signal the power of the signal at the output of the microelectromechanical filter and to detect the maximum power, the central frequency of the microelectromechanical filter then being the frequency of the calibration signal corresponding to this maximum value of power.

11. A circuit, comprising:
an input receiving an analog signal including a plurality of channels;
an upconversion device to upconvert the received analog signal;
a filter that filters the received analog signal and generates a filtered upconverted signal comprising information from a selected one of the channels and adjacent channel information, wherein the filter, from a design perspective, has a known bandwith defining a passband of the filter but a not accurately known center frequency of the passband; and
a calibration circuit that determines the not accurately known center frequency of the filter passband and configures the upconversion device to upconvert the received analog signal such that the selected one of the channels is placed at the determined center frequency, wherein the calibration circuit comprises:
a power measurement circuit;
a first switch to disconnect the analog signal from the upconversion device;
a second switch to connect an output of the filter to the power measurement device; and
a control circuit that varies a frequency transposition signal applied to the upconversion device and determines a frequency of the varying frequency transposition signal at which the power measurement device measures maximum power passing through the filter, that determined frequency being the center frequency.

12. The circuit of claim 11 wherein all of the recited components of the circuit are implemented on a single integrated circuit chip.

13. The circuit of claim 11 wherein the filter is a bulk acoustic wave filter.

14. The circuit of claim 11 wherein known the known bandwith defining the passband of the filter is wider than a plurality of channels.

15. A circuit, comprising:
an input receiving an analog signal comprising information from a selected one of a plurality of channels and adjacent channel information;
a downconversion device to downconvert the analog signal to an analog downconverted signal centered at a non-zero frequency;
a filter that filters the analog downconverted signal and generates a filtered analog downconverted signal comprising information from the selected one of the channels and less of the adjacent channel information, wherein the filter, from a design perspective, has a not accurately known center frequency; and
a calibration circuit that determines the not accurately known center frequency of the filter and configures the downconversion device to downconvert the filtered analog signal such that the selected one of the channels is placed at the determined center frequency, wherein the calibration circuit comprises:
a power measurement circuit;
a first switch to disconnect the analog signal from the downconversion device;
a second switch to connect an output of the filter to the power measurement device; and
a control circuit that varies a frequency transposition signal applied to the upconversion device and determines a frequency of the varying frequency transposition signal at which the power measurement device measures maximum power passing through the filter, that determined frequency being the center frequency.

16. The circuit of claim 15 wherein all of the recited components of the circuit are implemented on a single integrated circuit chip.

17. The circuit of claim 15 wherein the filter is a microelectromechanical filter.

18. A method for processing an analog signal including a plurality of channels;
upconverting the received analog signal;
filtering the upconverted received analog signal to generate a filtered upconverted signal comprising information from a selected one of the channels and adjacent channel information, wherein filtering comprises filtering with a filter that, from a design perspective, has a known bandwith defining a passband of the filter but does not have an accurately known center frequency of the passband;

downconverting the filtered upconverted signal to a downconverted signal at a non-zero frequency;

determining the not accurately known center frequency of the filter passband;

configuring upconverting to upconvert the received analog signal such that the selected one of the channels is placed at the determined center frequency;

wherein determining comprises:

disconnecting the analog signal from being upconverted;

connecting an output of the filter to a power measurement device;

varying a frequency transposition signal applied to effectuate upconverting; and determining a frequency of the varying frequency transposition signal at which the power measurement device measures maximum power passing through the filter, that determined frequency being the center frequency.

19. The circuit of claim 18 wherein known the known bandwith defining the passband of the filter is wider than a single channels.

* * * * *

UNITED STATES PATENT AND TRADEMARK OFFICE
CERTIFICATE OF CORRECTION

| | | |
|---|---|---|
| PATENT NO. | : 7,406,304 B2 | Page 1 of 1 |
| APPLICATION NO. | : 10/819367 | |
| DATED | : July 29, 2008 | |
| INVENTOR(S) | : Pierre Busson et al. | |

It is certified that error appears in the above-identified patent and that said Letters Patent is hereby corrected as shown below:

In the Claims:

At column 10, claim number 14, line number 21, please replace the phrase [wherein known the known] with the phrase -- wherein the known --.

At column 12, claim number 19, line number 10, please replace the phrase [wherein known the known] with the phrase -- wherein the known --.

At column 12, claim number 19, line number 12, please replace the word [channels] with the word -- channel --.

Signed and Sealed this
Sixth Day of March, 2012

David J. Kappos
*Director of the United States Patent and Trademark Office*